METHOD FOR BONDING THE FLIP-CHIP TO A CARRIER SUBSTRATE

Filed Oct. 14, 1968 2 Sheets-Sheet 1

INVENTOR
EDWIN P. MIKLASZEWSKI
BY
S. C. Yeaton
ATTORNEY

METHOD FOR BONDING THE FLIP-CHIP TO A CARRIER SUBSTRATE

Filed Oct. 14, 1968 2 Sheets-Sheet 2

INVENTOR
EDWIN P. MIKLASZEWSKI
BY
S. C. Yeaton
ATTORNEY 3,559,279

METHOD FOR BONDING THE FLIP-CHIP TO A CARRIER SUBSTRATE

Edwin P. Miklaszewski, Danbury, Conn., assignor to Sperry Rand Corporation

Filed Oct. 14, 1968, Ser. No. 767,431
Int. Cl. B23k *5/22, 31/02*
U.S. Cl. 29—493 1 Claim

ABSTRACT OF THE DISCLOSURE

A method for face down bonding a flip-chip to a carrier substrate including the steps of orienting the chip by direct reference to its electrical terminals at a given position apart from the substrate; orienting the substrate with reference to the chip at a prescribed position separate from the chip position; transferring the chip from the given position to the substrate position, the transfer being accomplished in a manner to retain the relative orientation of the chip and substrate so that the corresponding electrical terminals thereof are placed in contacting relationship, and applying hot gas solder to the region between the chip and substrate to bond the contacting terminals.

BACKGROUND OF THE INVENTION

The present invention relates to the microelectronics art and more particularly to a method for face down bonding an integrated circuit flip-chip to a carrier substrate. The method is also applicable to other planar devices including thin and thick film elements and discrete components such as solid state diodes and transistors but is particularly suitable for use with integrated circuits and will therefore be described with reference to such devices. It should be understood, however, that the term "flip-chip" in the following specification and appended claims is intended to refer to planar structures in general.

In the early stages of the microelectronics art, integrated circuits were connected into a system by running a separate wire lead from each terminal of the integrated circuit devices to a corresponding terminal of a carrier substrate which in turn was connected to other components of the system. Since integrated circuit chips usually have a plurality of small, closely spaced terminals, the use of individual leads was tedious and time consuming. As a result, the face down bonding method was developed wherein a chip was inverted to position it over a substrate such that the respective terminals faced toward one another with corresponding terminal pairs in contacting relationship in preparation for simultaneously bonding by either soldering or thermo-compression techniques. An essential requirement for face down bonding obviously is that the height of all the terminals on the chip, and likewise those on the substrate, must be approximately equal to assure that the corresponding chip and substrate terminals are in contact. This requirement is particularly stringent when thermo-compression bonding is employed but may be relaxed somewhat where the terminals contain solder which can flow to compensate for slight differences in the height of the various terminals. In either case, soldering or thermo-compression, the task of placing the terminal pairs in registration preparatory to bonding has posed considerable difficulty. This is readily appreciated when it is noted that a chip measuring only 50 mils along each of its major surfaces may contain a dozen or more terminals separated by only 5 mils, each terminal having a height and width of approximately 1 mil and 4 mils, respectively. Heretofore, chips have been registered with respect to a substrate by an operator using a micro-manipulator in conjunction with an elaborate optical system comprising a microscope and mirrors to observe the terminals directly for controlling the position of the chip. This is a rather slow and costly procedure. In an alternative prior art method, an edge of a major surface of the chip was utilized as a reference line for locating the terminals. The success of this method was limited, however, by the lack of any convenient means for cutting the chip uniformly along a precisely located line.

SUMMARY OF THE INVENTION

The present invention overcomes the aforementioned limitations of the face down bonding procedure by the provision of a semiautomatic method for precisely positioning a chip and substrate apart from one another and then transferring the chip to the substrate position in alignment therewith. More specifically, the chip is located with direct reference to its terminals in a precisely positioned chip receptacle at a chip loading station. This is accomplished by an operator placing the chip, terminals down, in a receptacle having a cut-out region defining an edge of appropriate contour so that the chip is supported by means of its terminals resting on said edge. Since the edge is precisely located and the chip terminals are supported thereon, the chip location is thereby determined by reference to its terminals. To assist the operator in placing the chip in the receptacle, a slight vibration is applied thereto to cause the outer terminals to settle on the edge of the recessed region. In addition, a vacuum line is connected to the bottom of the cut-out region to withdraw air therefrom to aid in holding the chip in place. The substrate, on the other hand, is precisely located, terminals up, with the aid of a micro-manipulator and a microscope reticle pattern, at a substrate loading station and then a vacuum chuck is actuated to transfer the chip to a position over the substrate with the corresponding terminal pairs in contacting relationship in readiness for bonding by soldering or thermo-compression.

DESCRIPTION OF THE PREFERRED EMBODIMENT

Figure 1:
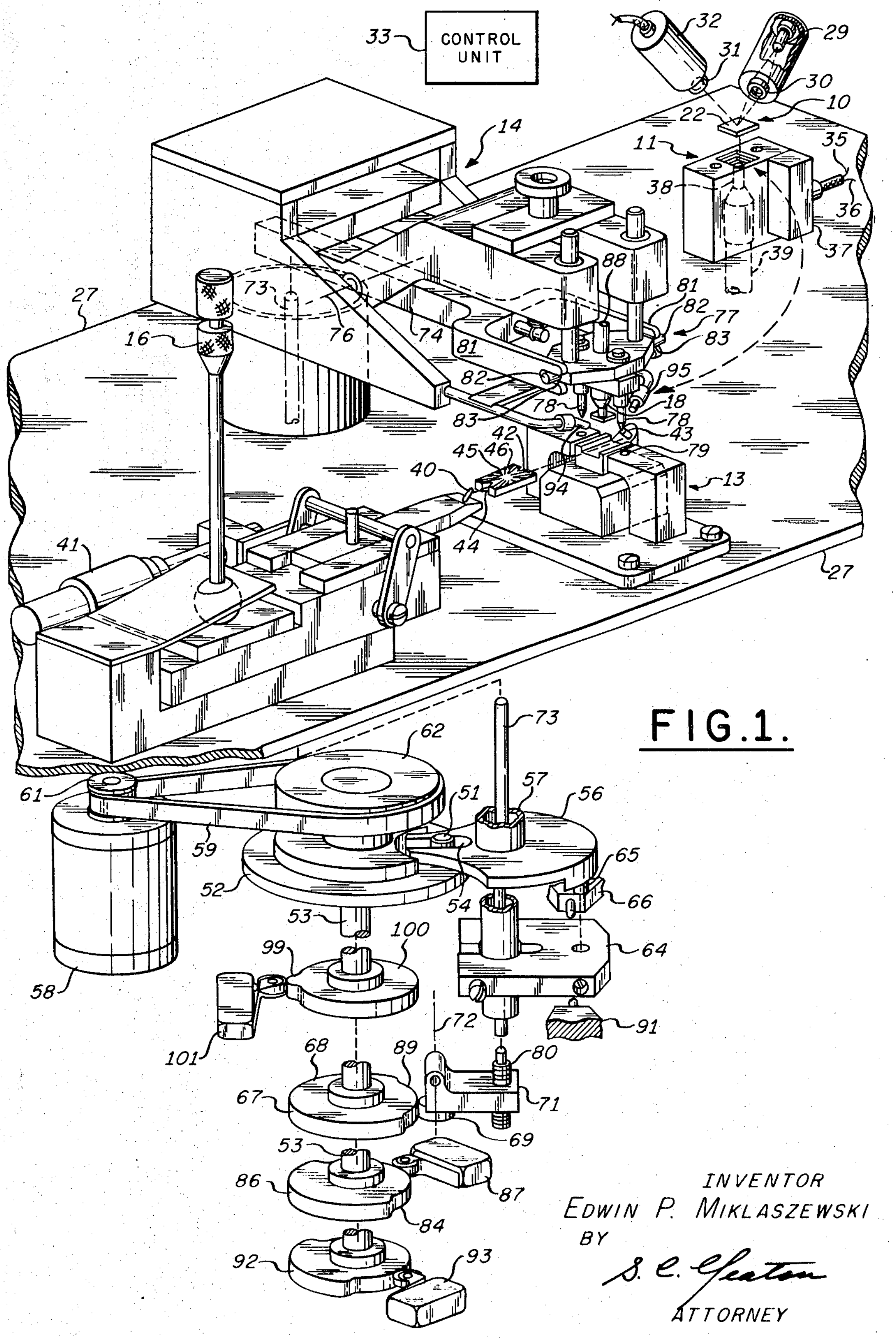
FIG. 1 is a perspective view of an apparatus for face down bonding a chip to a substrate in accordance with the method of the present invention.

Referring to FIG. 1, the face down bonding procedure of the present invention is performed in the following manner. An integrated circuit flip-chip 10 is placed terminals down in chip receptacle 11 and a carrier substrate 12 is placed terminals up in substrate holder 13. The chip receptacle is fixedly located relative to transfer mechanism 14 but the position of the substrate holder is adjustable by means of micro-manipulator control stick 16 for the purpose of aligning the substrate with respect to a fixedly oriented reticle pattern observed through a microscope as will be explained subsequently with reference to FIG. 3. Once the chip and substrate are properly secured in their respective positions, the transfer mechanism is actuated whereupon vacuum chuck 18 operates to remove the chip from receptacle 11 and transfer it to a position directly above the carrier substrate in preparation for being bonded thereto by a conventional thermo-compression or soldering technique. In the latter case, the solder forms an integral part of either the chip or substrate terminals so that the bond may be effected simply by applying forming gas to the area intermediate the chip and substrate, the forming gas acting as a reducing atmosphere to prevent oxidation.

Figure 2A:
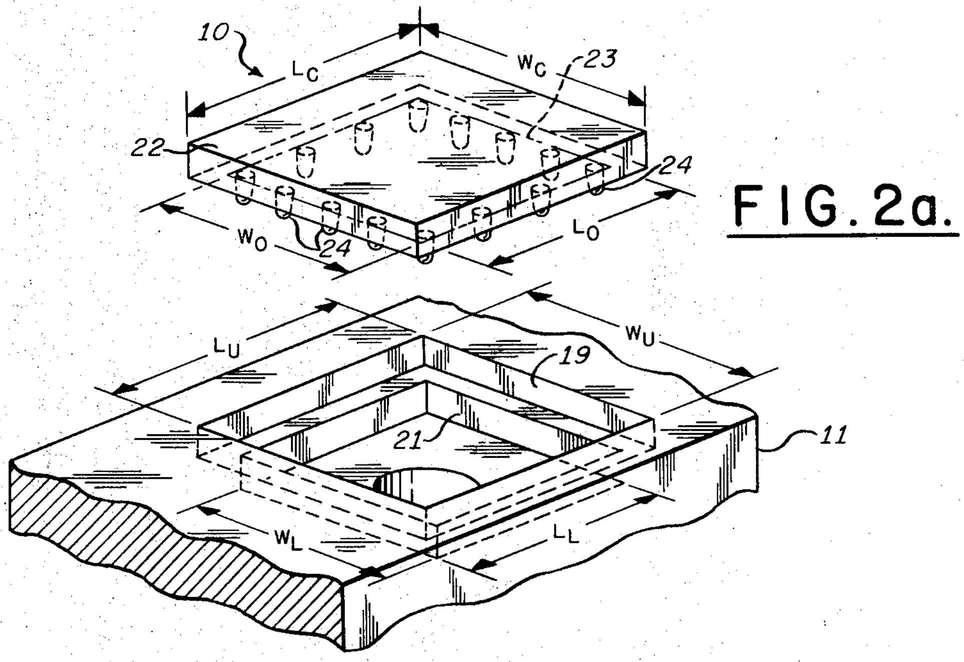
FIG. 2*a* is a perspective view of the chip receptacle used in the apparatus of FIG. 1 shown in relation to an integrated circuit chip.
Figure 2B:
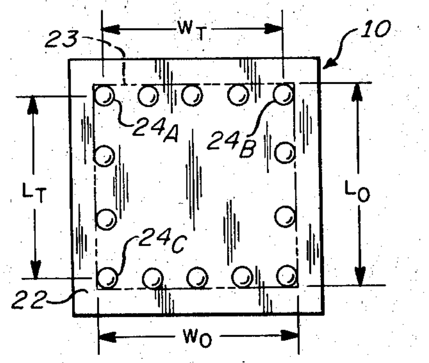
FIG. 2*b* is a plan view of the chip shown in FIG. 2*a*.
Figure 2C:
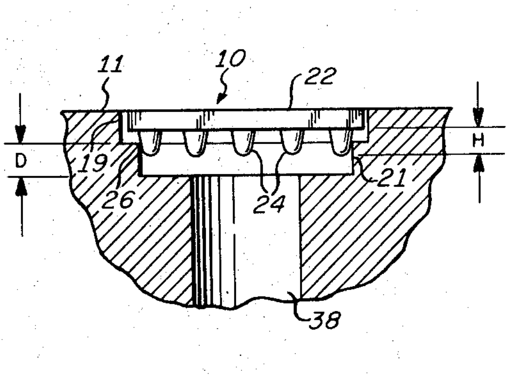
FIG. 2*c* is an elevational view of the chip receptacle showing the chip seated thereon.

As shown in FIGS. 2*a*, 2*b* and 2*c*, chip receptacle 11 has upper and lower recessed regions 19 and 21, respectively. Dimensions $W_U$ and $L_U$ of the upper region are slightly greater than the corresponding dimensions $W_C$ and $L_C$ of major surface 22 of the chip to provide coarse alignment of the chip as it is inserted into the receptacle. Dimensions $W_L$ and $L_L$ of lower region 21 must be less than dimensions $W_O$ and $L_O$ of outline 23 circumscribing the chip terminals 24 at the surface opposite surface 22 as shown in FIG. 2*a*. $W_L$ and $L_L$ must also be greater than the dimensions $W_T$ and $L_T$ from center-to-center of contacts $24_A$, $24_B$ and $24_C$. In addition, the depth D of the lower region must be slightly greater than the height H of the terminals. These tolerances will enable the chip to rest in the receptacle with the chip terminals seated on edge 26 between the upper and lower recessed regions as shown in FIG. 2*c*. Thus, since the receptacle and the recessed regions therein are spatially fixed, the chip also is fixedly oriented in accordance with the location of its terminals.

Skewing of the chip with respect to the horizontal plane of the machine base 27 resulting from the chip being supported close to the top of terminals at one side of the recessed region and close to the bottom of terminals at the opposite side will produce only a slight error in the spatial orientation of the chip. For instance, if the lower recessed region is constructed with dimension $W_L$ equal to the average of $W_O$ and $W_T$ and likewise for length $L_L$ relative to $L_O$ and $L_T$, then the maximum possible misalignment will be 1 mil for terminals having a width of 4 mils. This error added to an error of approximately 1 mil produced in the course of transferring the chip from the receptacle to the substrate position will still provide a 50% overlap of the chip and substrate terminals. Moreover, the misalignment error caused by skewing can be reduced by observing major surface 22 to check its alignment relative to the machine base. This is accomplished by means of an optical system comprising light source 29, lens 30, mask 31 and photocell 32. The light source is turned on by means of a pushbutton switch on control unit 33 to cause a light beam to impinge on the top surface of the chip for a brief interval. When the chip is properly seated in the receptacle, the light beam reflects from top surface 22 through an aperture in mask 31 onto the photocell whereupon an electrical signal is produced indicating readiness for commencing the bonding cycle which may begin either automatically or in response to an operator command.

Placing the chip in the receptacle is conveniently performed by an operator with the aid of an implement such as a pair of tweezers. In view of the small size of the chip, which is typically on the order of 50 mils in both length and width along its major surfaces, it is preferable that the receptacle be vibrated while the chip is being inserted therein to assure that it is properly seated in the lower recessed region. This is accomplished by closing another switch on the control unit to apply A.C. electrical energy on leads 35 and 36 to piezoelectric element 37 to impart a minute vibratory motion to the chip receptacle. Hole 38 leading from the lower recessed region to the bottom of the chip receptacle connects to a vacuum line 39 which runs to the control unit. In some instances, owing to the smaller size and light weight of the chip, it may be considered desirable to withdraw air from the recessed region as the chip is being placed thereon to aid in holding the chip in place.

The dimensions of the major surfaces of a carrier substrate are generally considerably larger than those of a flip-chip, typical dimensions for a substrate being on the order of ¼" by ½". As a result, a substrate is not as unwieldy as a chip and therefore can be placed in substrate holder 13 by an operator without the aid of any implements. This is performed by moving index pin 40 to the left against the restraint of air cylinder 41 and placing the substrate into the holder with notch 42 against fixed indexing pin 43. Then, indexing pin 40 is released enabling the air cylinder to force it into notch 44 thereby holding the substrate securely in place. Indexing pin 43 is manufactured to extremely stringent tolerances and an identical pin is used as a guide for the substrate when the terminals 45 and current conductive lines 46 are formed thereon by a photo-lithographic process in which the terminals are located at prescribed distances from a tangent to the fixed indexing pin.

Figure 3:
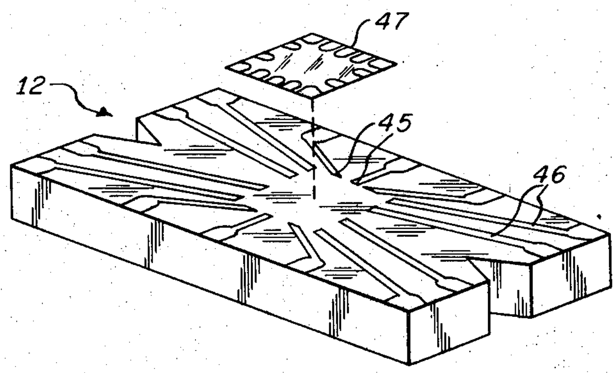
FIG. 3 is a perspective view of the carrier substrate overlaid by the reticle observed through the microscope used in the apparatus of FIG. 1.

As previously mentioned, the reticle pattern, which is observed through a microscope (not shown), overlaps a predetermined region on the substrate holder and has a fixed orientation thereon. The position of the substrate holder is therefore adjusted in a plane parallel to the machine base by means of micro-manipulator stick 16 to align the substrate terminals 45 with the reticle markings 47 as shown in FIG. 3. The microscope and reticle pattern are generally used, however, only for initial setup. Thereafter, the substrate is registered simply by means of the locating notches.

Referring to FIG. 1, the bonding operation commences with vacuum chuck 18 at a rest position intermediate the chip and substrate stations. In this position, pin 51 on Geneva driving wheel 52 affixed to primary shaft 53 is located in slot 54 of slotted wheel 56 affixed to secondary shaft 57. Application of electrical power to motor 58 from the control unit causes the primary shaft to rotate in a clockwise direction by means of belt 59 connecting wheel 61 to wheel 62 and at the same time rotates slotted wheel 56 in a counterclockwise direction to position the vacuum chuck over the chip station. Both shafts continue to rotate until pin 51 leaves slot 54 at which time arm 64, which is coupled to slotted wheel 56 by pin 65, comes into contact with stop 66 and secondary shaft 57 stops rotating. At this instant, vacuum chuck 18 is positioned above the chip receptacle. The primary shaft continues to rotate after pin 51 leaves slot 54 until the raised section 67 of cam 68 contacts cam-follower bearing 69 on lever 71 and rotates the lever about axis 72 into contact with pin 73 concentrically mounted within the secondary shaft. This action causes pin 73 to force against lever 74 rotating it about axis 76 so that the vacuum chuck, which is attached to floating head 77, moves down into contact with the major surface of the chip. As the chuck moves down to contact the chip, it is guided by pins 78 which fit in guide holes 79 on the chip receptacle. Spring 80 affixed to lever 71 prevents the vacuum chuck from being forced too hard against the chip. Any radial misalignment of the chip is compensated by the floating head to which the guide pins 78 are affixed, that is, the floating head is coupled to arm 81 by rods 82 (only one shown) such that the head can move within slots 83 in order for the guide pins to move into the guide holes which are precisely spaced from the center of the chip receptacle. As the primary shaft continues to rotate in a clockwise direction, the raised section 84 of cam 86 actuates switch 87 thereby reversing excitation to the motor and activating the vacuum system connected through line 88 into the vacuum chuck causing the chuck to grasp the upper surface of the chip. Upon reversal of the motor excitation, the primary shaft begins to rotate in the counterclockwise direction and when the indented section 89 of cam 68 engages cam-follower bearing 69, the chip is lifted from the receptacle. As the primary shaft rotates further in the counterclockwise direction, pin 51 enters slot 54 and drives slotted wheel 56, secondary shaft 57 and arm 64 in the clockwise direction until pin 51 again leaves the slot and arm 64 contacts stop 91, at which time the vacuum chuck will be positioned directly above the carrier substrate.

In the course of moving the chip to the substrate station protrusion 99 on cam 100 momentarily closes switch 101. As the primary shaft continues to rotate in the counterclockwise direction, the raised section 67 of cam 68 once again operates lever 71 and moves the vacuum chuck down to position the chip on the substrate. Shortly thereafter, cam 92 actuates switch 93 whereupon forming gas is ejected through nozzles 94 and 95 into the region between the chip and substrate to melt the solder on the chip terminals and thus effect the bond between the chip and substrate terminals. As the primary shaft rotates further in the counterclockwise direction, the raised section 84 of cam 86 actuates switch 87 reversing the electrical power applied to the motor and deactivating the vacuum system so that the chuck releases the chip. Thereafter, the chuck rises and returns to the start position. This control is accomplished by the primary shaft moving in a clockwise direction until protrusion 99 on cam 100 actuates switch 101 for the second time. As switch 101 closes, a two count device in the control unit operates to remove electrical power to the motor thereby stopping the vacuum chuck at the rest position in readiness for the commencement of the next bonding sequence.

While the invention has been described in its preferred embodiment, it is to be understood that the words which have been used are words of description rather than limitation and that changes within the purview of the appended claim may be made without departing from the true scope and spirit of the invention in its broader aspects.

I claim:

1. A method for bonding to a substrate a chip having a plurality of tapered contacts arranged in a rectangular pattern, including the steps of orienting the chip at a first position apart from and with respect to the substrate by seating the surface of each chip contact intermediate the peak of the contact and the point of attachment to the chip along a fixedly located edge circumscribing the plurality of contacts, aligning the substrate at a second position apart from the chip with respect to spatially fixed intersecting axes aligned parallel to a major surface of the substrate, transferring the chip from the first position to the second position to place the chip contacts in mating relation with the corresponding substrate contacts, and bonding the chip contacts to the substrate contacts.

References Cited

UNITED STATES PATENTS

| | | | |
|---|---|---|---|
| 3,165,818 | 1/1965 | Soffa et al. | |
| 3,276,854 | 10/1966 | Felker et al. | 29—589X |
| 3,289,046 | 11/1966 | Carr | 29—577X |
| 3,391,451 | 7/1968 | Moore | 29—577 |

OTHER REFERENCES

FBM Technical Disclosure Bulletin, vol. 10, No. 2, July 1967, "Conductive Land Pattern" by A. N. Romano.

JOHN F. CAMPBELL, Primary Examiner

R. J. SHORE, Assistant Examiner

U.S. Cl. X.R.

29—577, 589; 228—4, 49